US006807125B2

United States Patent
Coteus et al.

(10) Patent No.: US 6,807,125 B2
(45) Date of Patent: Oct. 19, 2004

(54) CIRCUIT AND METHOD FOR READING DATA TRANSFERS THAT ARE SENT WITH A SOURCE SYNCHRONOUS CLOCK SIGNAL

(75) Inventors: Paul W. Coteus, Yorktown Heights, NY (US); Frank D. Ferraiolo, Essex Junction, VT (US); Kevin C. Gower, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 10/225,871

(22) Filed: Aug. 22, 2002

(65) Prior Publication Data

US 2004/0037158 A1 Feb. 26, 2004

(51) Int. Cl.[7] ............................................. G11C 11/00
(52) U.S. Cl. ............. 365/233; 365/230.01; 365/230.08; 365/239; 365/191; 365/194; 365/189.06; 711/104; 711/105; 711/167; 711/169
(58) Field of Search ........................... 365/233, 230.01, 365/230.08, 239, 191, 194, 189.06; 711/104, 105, 167, 169

(56) References Cited

U.S. PATENT DOCUMENTS

| 6,016,283 A | 1/2000 | Jeong | 365/233 |
|---|---|---|---|
| 6,044,026 A | 3/2000 | Morgan | 365/194 |
| 6,061,292 A | 5/2000 | Su et al. | 365/230.06 |
| 6,078,546 A | 6/2000 | Lee | 365/233 |
| 6,081,477 A | 6/2000 | Li | 365/333 |
| 6,100,733 A | 8/2000 | Dortu et al. | 327/149 |
| 6,118,729 A | 9/2000 | Hirabayashi et al. | 365/233 |
| 6,266,750 B1 * | 7/2001 | DeMone et al. | 711/169 |
| 6,295,245 B1 * | 9/2001 | Tomita et al. | 365/230.08 |
| 6,493,285 B1 * | 12/2002 | Wolford | 365/233 |
| 6,510,503 B2 * | 1/2003 | Gillingham et al. | 711/167 |
| 2001/0047450 A1 * | 11/2001 | Gillingham et al. | 711/105 |
| 2002/0010831 A1 * | 1/2002 | DeMone et al. | 711/105 |
| 2002/0161968 A1 * | 10/2002 | Yoo et al. | 711/105 |
| 2002/0174311 A1 * | 11/2002 | Ware et al. | 711/167 |
| 2003/0065877 A1 * | 4/2003 | Gillingham et al. | 711/104 |

FOREIGN PATENT DOCUMENTS

| JP | 02000031954 A | * | 1/2000 | H04L/7/033 |
|---|---|---|---|---|
| JP | 020002230973 A | * | 8/2002 | G11C/11/407 |

* cited by examiner

*Primary Examiner*—Viet Q. Nguyen
(74) *Attorney, Agent, or Firm*—Floyd A. Gonzalez

(57) ABSTRACT

A circuit and method for reading data transfers that are sent with a source synchronous clock signal. The circuit has a data input for receiving data signals carrying data being transferred, a clock input for receiving synchronous clock signals, and a delay circuit connected to the clock input for generating a delayed clock signal which is delayed from said synchronous clock signal a predetermined time period. The circuit also includes a pipeline connected to the data input for sampling the data on the data input in response to said delayed clock signal thereby stretching the sampling of incoming data.

8 Claims, 7 Drawing Sheets

CIRCUIT AND METHOD FOR READING DATA TRANSFERS THAT ARE SENT WITH A SOURCE SYNCHRONOUS CLOCK SIGNAL

BACKGROUND OF THE INVENTION

The present invention is related to a circuit and method for reading data transfers, and is more particularly related to reading data transfers that are sent with a source synchronous clock signal.

When sampling double data rate, (DDR) data transfers that are sent with a source synchronous clock, such as in SDRAM-DDR memory devices, the requirement for correct interface operation is that the incoming data is safely sampled during a known internal clock cycle. The total number of cycles required for transmission is not important if the data can be transferred into a predetermined internal clock cycle. Because the arrival of the incoming clock and data signals can vary greatly with respect to the desired internal sample cycle, this is often a difficult task.

SUMMARY OF THE INVENTION

There is thus a need to be able to correctly sample incoming DDR data over a wide range of arrival times with minimal latency added to the receiving of that data and with substantial immunity from spurious noise signals on the source synchronous clock and data, such as occurs during switching from accessing one memory device to accessing another memory device sharing a common clock and data line. The circuit of the present invention can be used to receive data and clock signals from two or more different sources that share the same electrical connections with different transmission times, (as is the case when multiple SDRAM-DDR memory devices share a common data interface to a controlling chip) as long as the range of arrivals is within the tolerances of the receiving circuit.

The circuits in this invention sample incoming, source synchronous, DDR data by: stretching the incoming even and odd transfers of data signals using latches clocked by an appropriately delayed data strobe signal; capturing this stretched data into intermediary clock domain latches that have their clocks delayed to safely capture all possible arrivals of stretched, incoming data; transferring this intermediary latch data into a latch on the internal clock domain during the programmed, internal target arrival cycle. The advantages of this approach over simply latching the incoming data with the delayed data strobe and then transferring into the local clock domain are as follows. If a transparent latch is used to capture the incoming data with the delayed data strobe the otherwise added latency of one half of a bit time can be avoided. Also, by using an intermediary latch to sample the stretched data captured by the data strobe, a greater range of data arrivals with respect to the internal target arrival cycle can be tolerated.

BRIEF DESCRIPTION OF THE DRAWINGS

These and other objects will be apparent to one skilled in the art from the following detailed description of the invention taken in conjunction with the accompanying drawings in which.

DESCRIPTION OF THE PREFERRED EMBODIMENT

Figure 1:
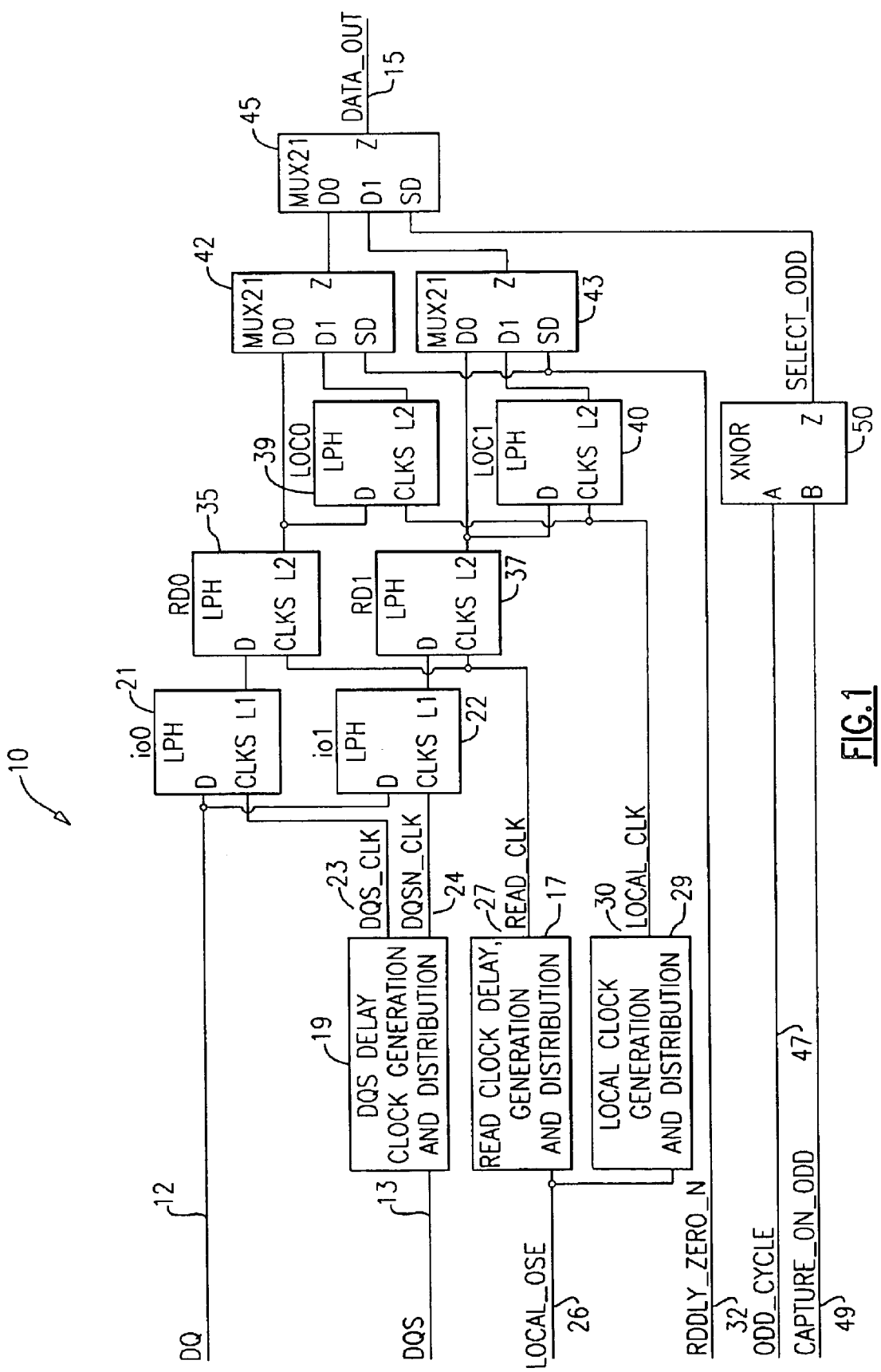
FIG. 1 is a schematic diagram of a data sample circuit of the present invention having a data input, a synchronous clock having a double data rate, and an output supplying the data transferred into a predetermined internal read clock cycle.

FIG. 1 is a schematic diagram of a data sample circuit 10 having a data input 12, a synchronous clock signal on clock input 13 having a double data rate, and an output 15 supplying the data received at the input 12 transferred into the cycle of a predetermined internal read clock 17. The circuit 10 includes an even cycle pipeline made up of io0 latch 21, rd0 latch 35, loco latch 39 and 2-1 multiplexer 42, to be explained. Similarly, the circuit 10 includes a odd cycle pipeline made up of io1 latch 22, rd1 latch 37, loc1 latch 40, and a 2-1 multiplexer 43, to be explained. As will be explained, a 2-1 multiplexer 45 acts as a selecting device to select the output of either the even cycle pipeline or the odd cycle pipeline. The circuit 10 correctly samples incoming data (dq) at the input 12 using a source synchronous double data rate clock (dqs) on 13 as will be described.

The received dqs signal is first delayed by a dqs delay clock generation and distribution circuit 19 such that it will clock the dq signals in the center of their valid windows. In the case of an edge aligned dqs, this would mean that roughly half of a dq bit time would be added to the entire dqs distribution. System timing analysis is used to determine the delay needed, and if sampling is on the even or odd cycle, as will be explained.

The dqs signal is shaped by circuit 19 into clock pulses as required by a latch, to be described, that will be used to capture the incoming data. Because both edges of the dqs signal on 13 will be used to sample dq signal on 12, both the true and inverted dqs are used to form both a positive clock, (dqs_clk) at the positive output 23 of the circuit 19 and a negative clock (dqsn_clk) at the negative output 24 of the circuit 19.

For each incoming dq, the dqs_clk of 23 is fed to the CLK input of a transparent latch 21 (io0) that flushes and holds the even transfers of dq signal. The dqsn_clk of 24 is fed to the CLK input of another transparent latch 22 (io1) that flushes and holds the same dq signal during odd transfers, since the dqsn_clk is out of phase with the dqs_clk. Because latches 21 and 22 are transparent during the arrival of the transfer they are to capture, there are no clock cycles of latency added to the dq signal.

Because these transparent latches 21 and 22 hold the last passed transfer when their clocks are deasserted, the sampled transfer is stretched at the output pin of the transparent latch so that it may be more easily sampled by latches downstream in the circuit, to be explained. The valid width of the signals leaving the io0 and io1 latches 21 and 22 respectively, are stretched to one dq bit time plus the setup of the dq to the dqsn_clk.

A local oscillator signal is placed on input 26 and is inputted into the read clock delay, generation and distribution circuit 17 which has an output 27 for supplying the read clock (read_clk) signal, and a local clock generation and distribution circuit 29 which has an output for supplying the local clock (local_clk) signal. The L1 output of latch 21 is connected to the data input of a read latch 35 (rd0), and the L1 output of latch 22 is connected to the data input of a read latch 37 (rd1).

Latches 35 and 37 are clocked by the read_clk signal of 27. If the window of the latches 21 and 22 satisfies the required time for a valid sample into the circuit's internal, or local clock domain, then the read delay rddly_zero_n signal on input 32 should be externally programmed to a logic '0' and the read_clk delay of circuit 17 set to zero so that the read_clk signal at 27 is in phase with the local_clk signal at 30. This will cause the signal at the L1 output of latch 21 and the signal at the L1 output of latch 22 to be sampled by the read latches 35 and 37 and driven out on the data_out signal on 15 in phase with the local_clk domain.

Because the sampling of data into the read_clk clock domain occurs only once per cycle it is possible that the stretched windows of io latches 21 and 22 do not overlap this valid sample time at a given clock frequency and/or dq arrival time. When this occurs, the read_clk is programmed to occur before the local_clk cycle in which the data is to be captured.

The L2 output of read latch 35 is connected to the D input of local latch 39 (loc0) and the L2 output of the read latch 37 is connected to the D input of the local latch 40 (loc1). The local latches 39 and 40 are not used when the read clock is the same as the local clock. Local latches 39 and 40 are clocked by the local_clk signal of 30. The programming of the read_clk delay of circuit 17 must make it early enough such that the signals are always safely transferred from the read_clk domain latches 35 and 37, (rd0 and rd1) into the local latches 39 and 40, but not too early (less than one local_clk cycle) such that the read latches 35 and 37 outputs will still be valid during the sampling local_clk cycle.

The L2 outputs of the read latches 35 and 37 are connected to the D0 inputs of 2-1 multiplexers 42 and 43, respectively, and the L2 outputs of the local latches 39 and 40 are connected to the D1 inputs of the multiplexers 42 and 43, respectively. The multiplexers 42 and 43 are selected by the read delay rddly_zero_n signal on 32. The Z output of the multiplexer 42 is connected to the D0 input of a 2-1 multiplexer 45, and the Z output of the multiplexer 43 is connected to the D1 input of the multiplexer 45. The Z output of multiplexer is the data_out terminal 15 of the circuit 10. An odd_cycle signal is supplied on input 47, and a capture_on_odd signal is supplied on input 49. These signals on 47 and 49 are inputted to an Exclusive NOR (XNOR) circuit 50. When both the odd_cycle and capture_on_odd signals are zero, the output of the XNOR circuit 50 will be one, and the odd or D1 input of multiplexer 45 (odd cycle pipeline) will be selected as the data_out signal.

If the stretched io window of the io latches 21 and 22 do not overlap any of the valid read_clk delay points in the cycle that is previous to the local_clk cycle that will capture the data, then the local_clk cycle used to sample the data can be changed by programming the capture_on_odd signal input to the circuit.

The use of the dqs_clk and dqsn_clk at the io latches 21 and 22 to stretch the data produces a larger valid window at which the dq signals on 12 can be sampled. The use of the read_clk and read latches 35 and 37 allows the sample point to be programmed up to one cycle earlier than the target local clock sample cycle. The phase of the select line to the final multiplexer 45 can be changed to allow the dq signal on 12 to be sampled in the local clock domain on both even and odd local_clk cycles.

It will be understood that more than one memory device such as Random Access Memory (RAM) chips may be connected at input 12. In the time between reading a first RAM and reading a different RAM, the shared dqs bus 12 can momentarily have no master, and since it may be terminated to the VDDQ/2 voltage, or the switch point of the dqs receiver, the dqs line 12 can receive noise signals which the controller interprets as a clock upon which to sample data. The ability to position a local clock to sample the stretched data at the nominal arrival time provides an increased level of noise immunity because the data is ignored on internal cycles in which its validity is not guaranteed through timing analysis.

Figure 2:
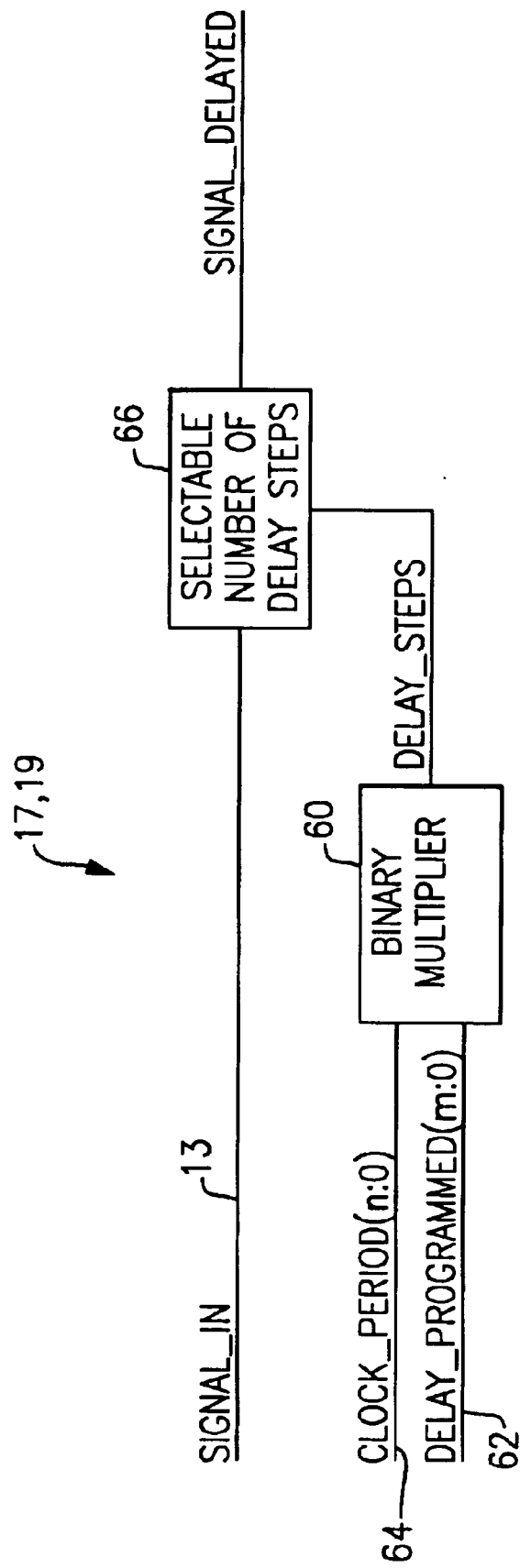
FIG. 2 is a schematic diagram of a signal delay circuit usable with the data sample circuit of FIG. 1.

FIG. 2 is a schematic diagram of the delay circuits 17 and 19 of FIG. 1. These circuits creates a process, voltage and temperature, (PVT) compensated delay using digital circuit elements by specifying the amount of desired delay in fractions of a clock period instead of in absolute units of time, (ns, ps, etc.). By using a fraction of a known delay size that is calculated separately after power-on reset, the large errors caused by traditional digital delay techniques can be avoided. This technique will use much less circuit area than an analog delay technique with similar accuracy.

When adding a programmable amount of delay to the propagation of signals through digital circuits, it is desirable to ensure that the actual amount of delay added is as close as possible to the desired amount. The generation of precisely delayed signals is especially useful when communicating to external devices that have specified arrival times of the signals used for this communication. Synchronous memory devices such as SDRAM and SDRAM-DDR are examples of such devices. Precise delay circuits can be used to generate control, data and clock signals to these devices that satisfy their setup and hold time requirements. When an SDRAM-DDR sends dq and dqs signals back to a controlling chip during a read operation, a delay on the dqs signal is required to move the edge aligned dqs signal into the center of the dq valid window so that the dq can be safely captured by the receiving chip. The uncertainty of the delayed signal caused by error in the delay generation circuit will limit the speed of communication to and from the remote devices. The amount of delay that results from sending signals through a delay element with a pre-programmed number of delay steps can vary greatly as the technology process, voltage and operating temperature are changed.

This is done by using the result of a clock period calculation, performed separately, that measures the number of delay steps that are required to delay a signal by one full clock cycle under the current PVT conditions. This result arrives as a vector of binary signals. The amount of delay desired is specified in binary vector form as a fraction of a whole clock cycle. The digital delay circuit uses digital, combinatorial logic 60 to multiply the number of delay elements inputted at 62 in a whole clock cycle inputted at 64 by the fraction of a cycle that is desired and delays the incoming signal (for instance dqs) by the resulting number of delay elements selected at delay circuit 66. The amount of error in the actual delay applied is greatly reduced from the full PVT variation. The error in the delay will be no worse than the sum of the round off error of the binary math, the on chip process tracking error possible between the master, clock period calculating delay circuit and this slave delay circuit and the change in delay from voltage and temperature changes that occur after the clock period calculation has been performed. This last error term can be greatly reduced by periodically recalculating the number of delay elements in one clock cycle under the current VT condition and applying this new resulting delay value by the delay circuit of FIG. 2.

FIGS. 3–7 are timing diagrams that show signals propagating through the circuit under various arrival and programmed conditions.

Figure 3:
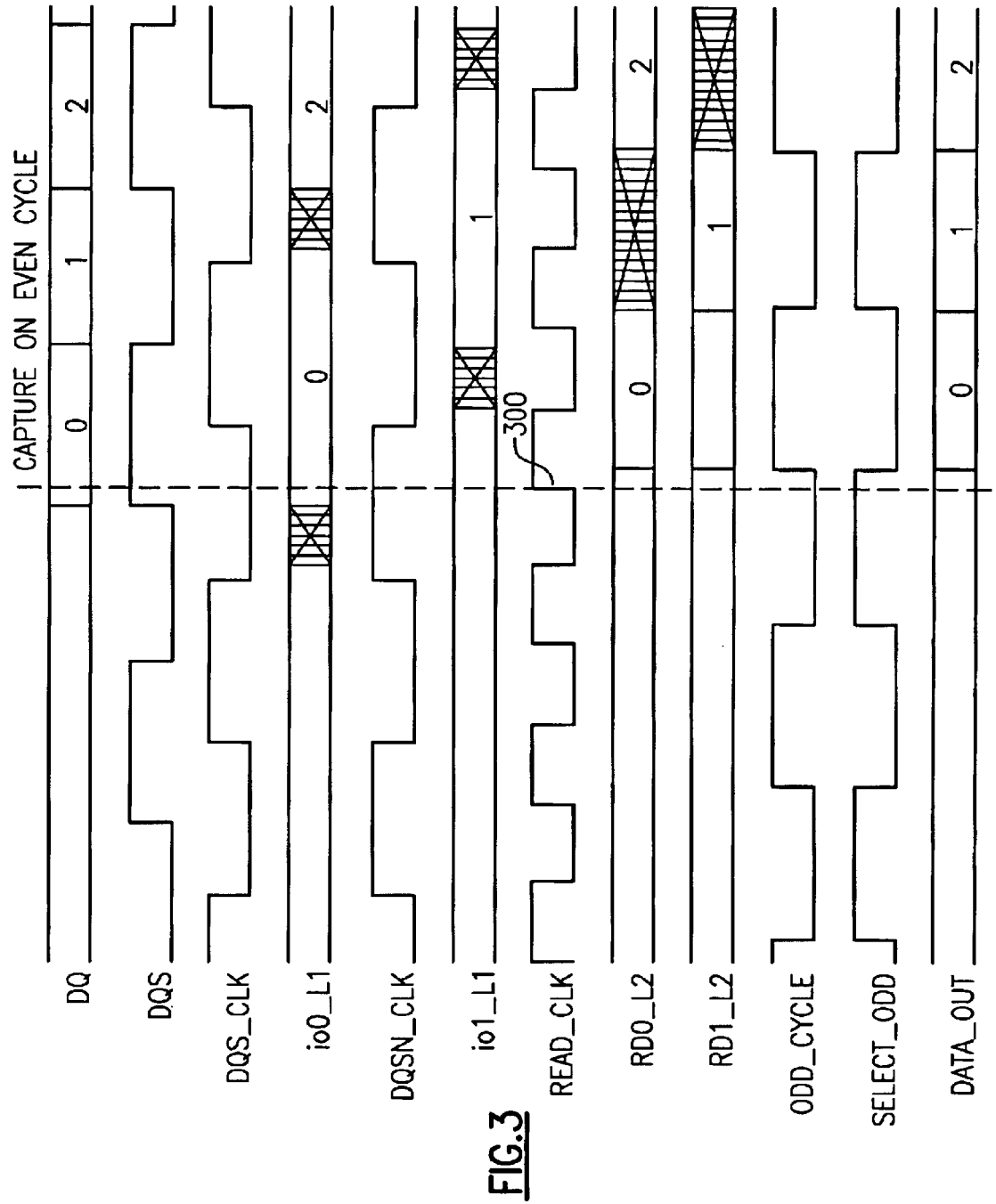
FIG. 3 is a timing diagram of the circuit of FIG. 1 of the latest arriving data and source clock with the read clock delay equal to zero.

FIG. 3 is a timing diagram of the latest arriving dq and dqs signals with the read_clk signal delay being equal to zero. As shown in FIG. 3, capture of the data at the edge 300 of the read_clk is on the even cycle.

Figure 4:
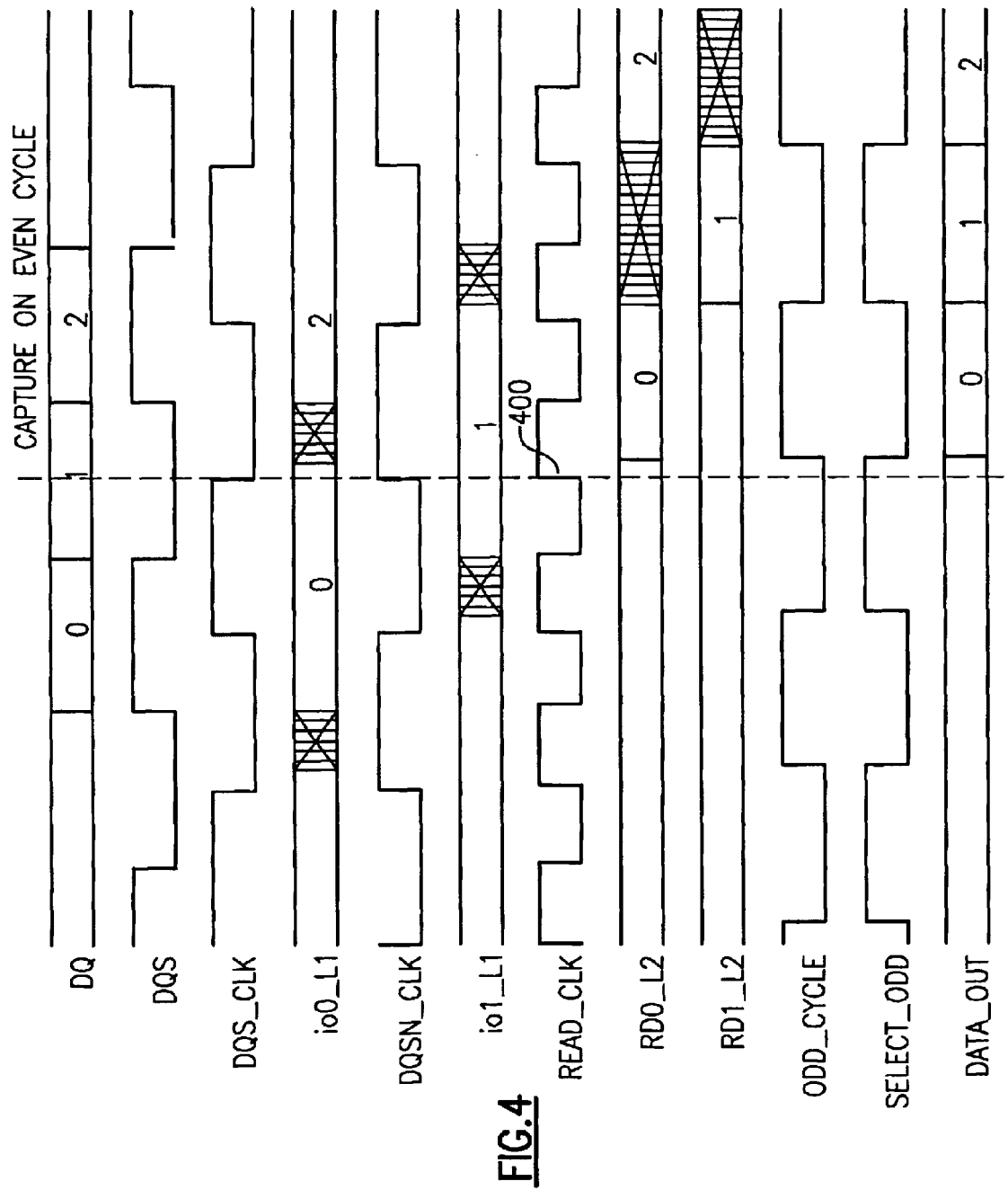
FIG. 4 is a timing diagram of the circuit of FIG. 1 of the earliest arriving data and source clock with the read clock delay equal to zero.

FIG. 4 is a timing diagram of the earliest arriving dq and dqs signals with the read_clk signal delay equal to zero. As shown in FIG. 4, capture of the data at the edge 400 of the read_clk is on the even cycle.

Figure 5:
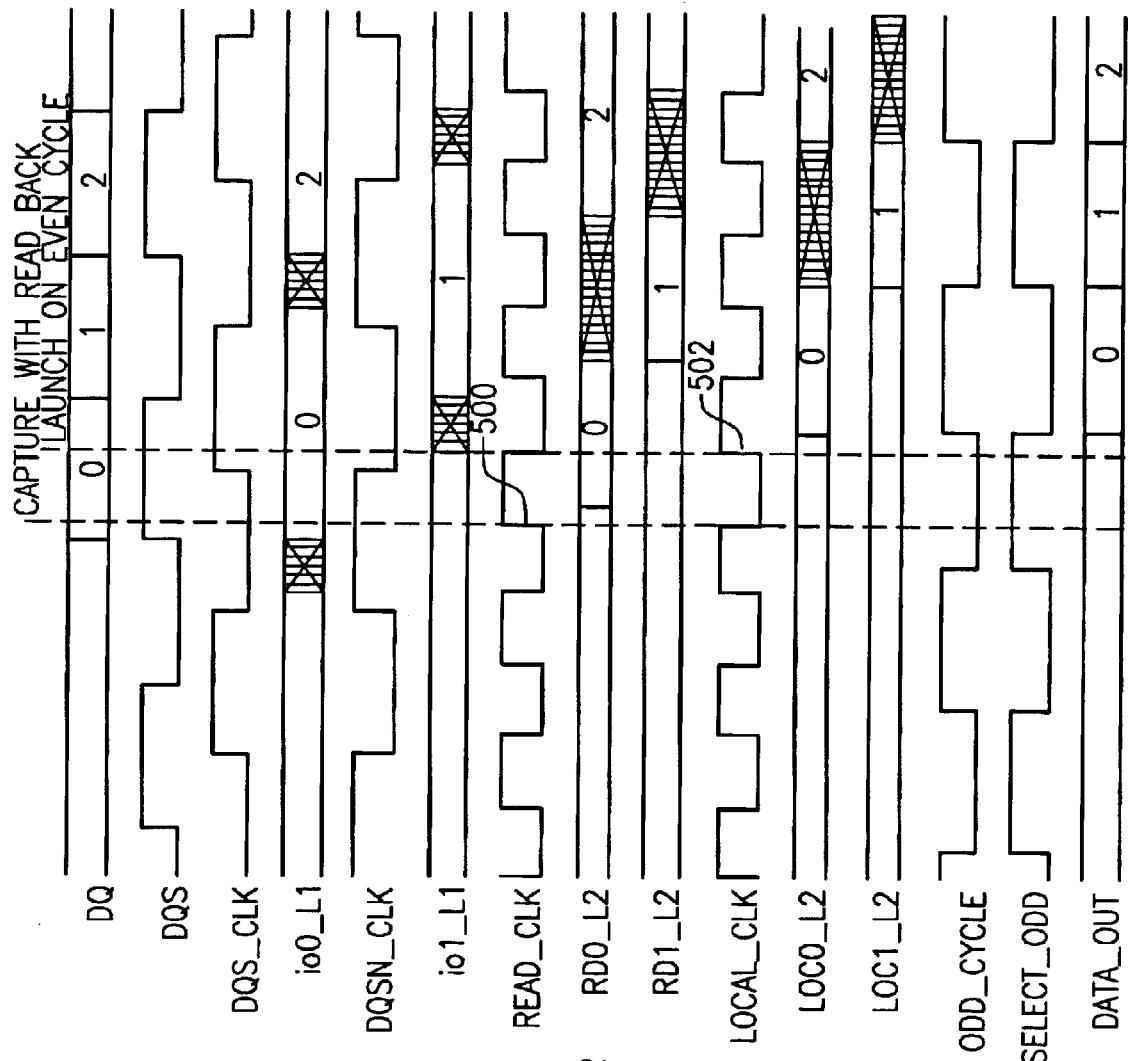
FIG. 5 is a timing diagram of the circuit of FIG. 1 of the latest arriving data and source clock with the read clock delay equal to one half of the bit time.

FIG. 5 is a timing diagram of the latest arriving dq and dqs signals with the read_clk signal delay equal to one half of a bit time. The edge 500 of the read_clk signal captures the data, and the data is launched by the edge 502 of the local_clk signal on the even cycle.

Figure 6:
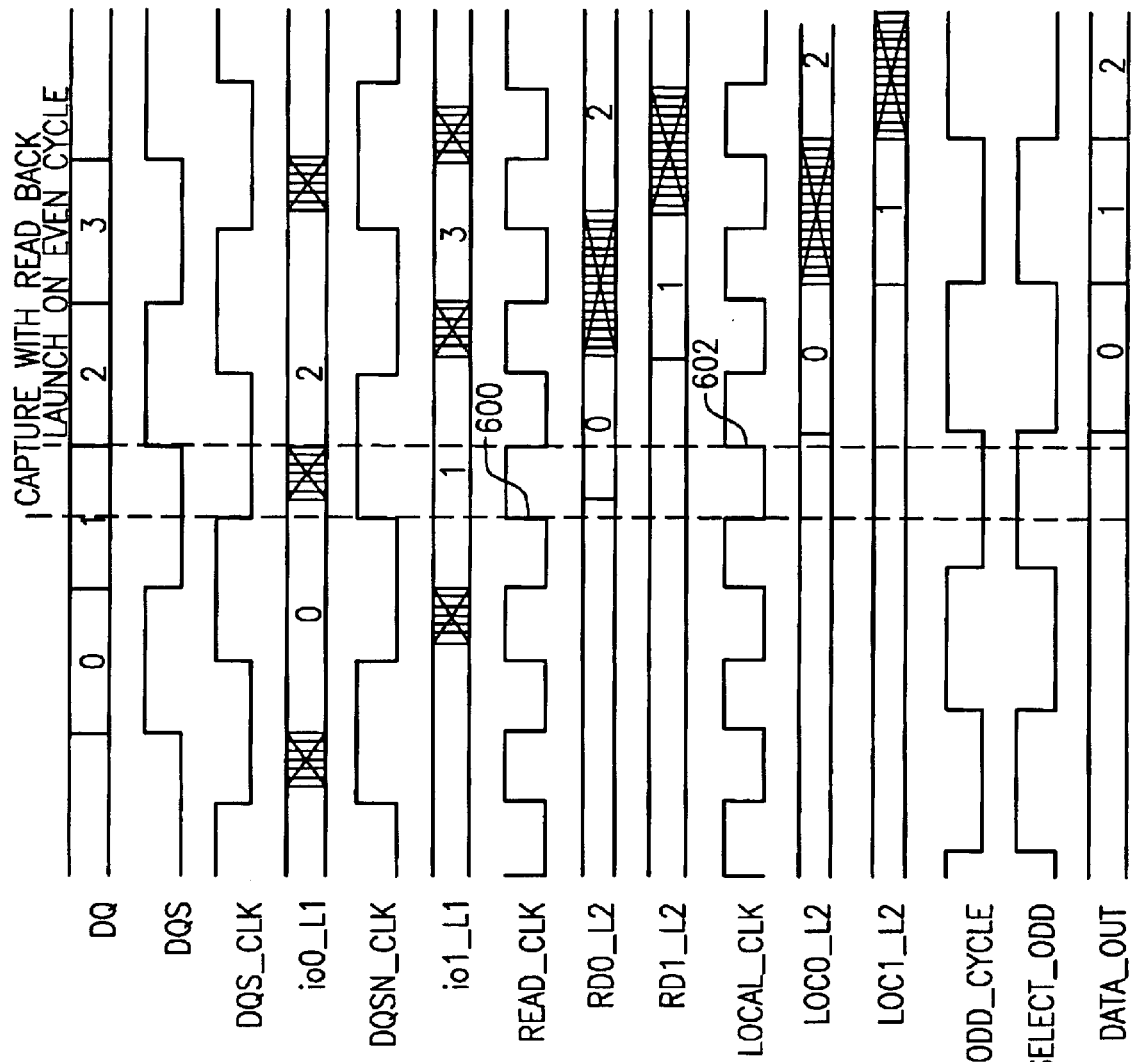
FIG. 6 is a timing diagram of the circuit of FIG. 1 of the earliest arriving data and source clock with the read clock delay equal to one half of the bit time.

FIG. 6 is a timing diagram of the earliest arriving dq and dqs signals with the read_clk delay being equal to one half of the bit time. The edge 600 of the read_clk signal captures the data, and the data is launched by the edge 602 of the local_clk signal on an even cycle.

Figure 7:
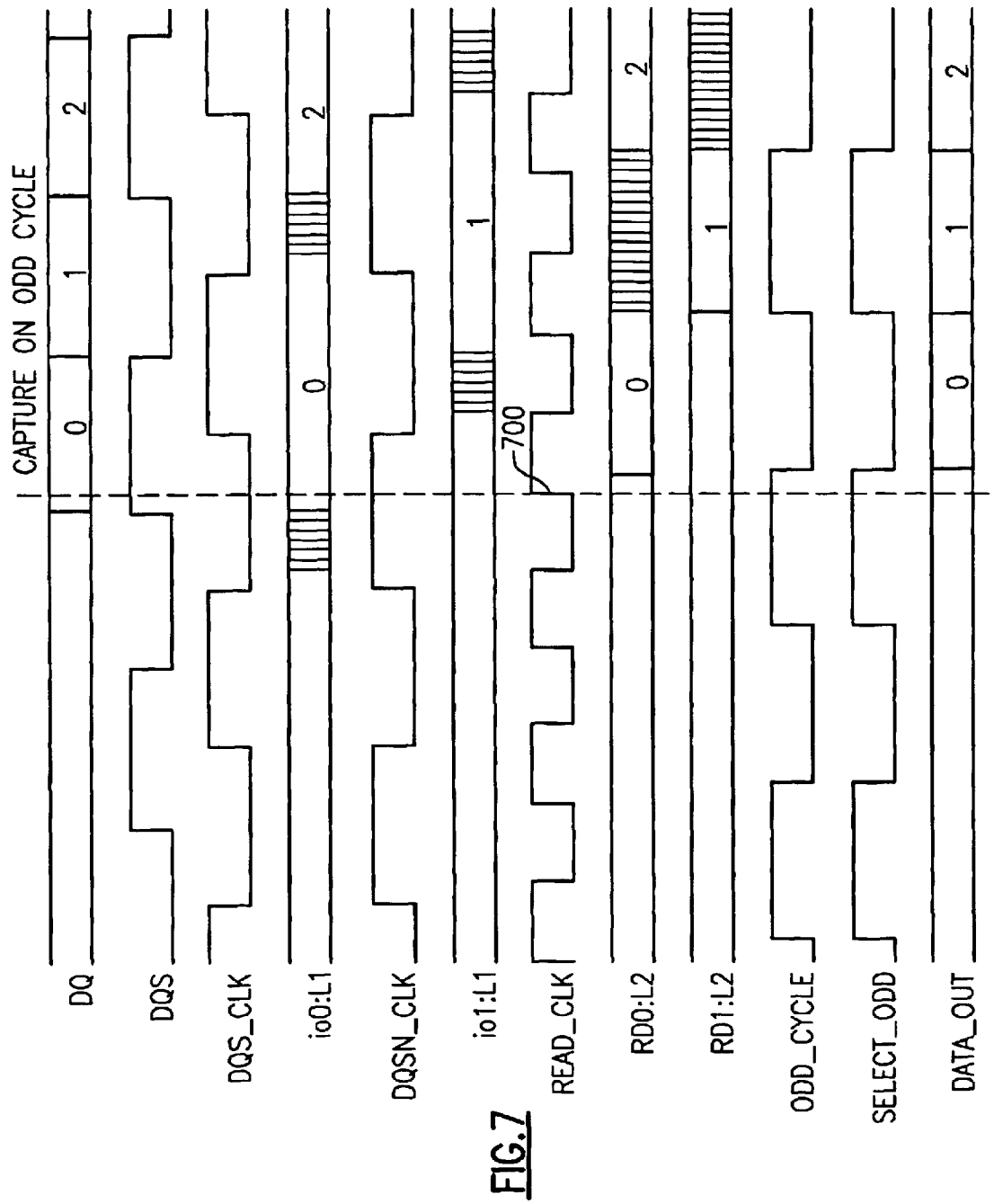
FIG. 7 is a timing diagram of the circuit of FIG. 1 of the latest arriving data and source clock with the read clock delay equal to equal to zero.

FIG. 7 is a timing diagram of the latest arriving dq and dqs signals with the read_clk signal delay equal to zero. The data is captured by edge 700 of the read_clk signal.

The concepts of the present invention can be extended to provide a mode in which a greater range of possible arrivals of dq and dqs signals, (higher elasticity) are safely captured at the expense of adding half of a dq bit time to the latency of the sampling circuit. The change to the circuit involves changing io0 latch 21 and io1 latch 22 to edge triggered latches or polarity hold latches (LPH). The resulting change to the timings is that the data from the LPH latches would be stretched to 2 dq bit times in width and would be nominally delayed by half a dq bit time from its arrival at the io latches. This can be implemented as a configurable option by adding 2-1 multiplexers to the inputs of the read latches 35 and 37.

The concepts of the present invention can be extended to function similarly in the case where the local_clk signal runs at the same frequency as dqs signal. In this case the final data_out multiplexer 45 is removed and there would be two data_out signals, data_out0 and data_out1 that are equal to the even and odd dq transfers on each internal local_clk cycle respectively. The io0 transparent latch 21 may then be replaced with a full LPH latch. This lines up the trailing edges of the signal from the L2 output of io0 latch 21 and L1 output of the io1 latch 22 before being sampled by the read_clk signal in the rd0 and rd1 latches 35 and 37, respectively.

The concepts of the present invention can also be further extended to provide a mode in which a greater range of possible arrivals of dq and dqs signals, (higher elasticity) are safely captured at the expense of adding half of a dq bit time to the latency of the sampling circuit. The change to the circuit involves changing io1 latch 22 to an LPH latch, and adding another transparent latch, (LPH latch with L1 output) named io2 between io0 latch 21 and rd0 latch 35. The resulting change to the timings is that both inputs to the read latches 35 and 37 are stretched to 2 dq bit times in width, with both leading and trailing edges aligned. Both inputs to the read latches 35 and 37 will also be delayed by half of a dq bit time from its arrival at the io latches (21 and 22). This can be implemented as a configurable option by adding a 2-1 multiplexer to the inputs of the read latches 35 and 37.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A circuit for reading data transfers that are sent with a source synchronous clock signal, said circuit comprising:
    a data input for receiving data signals carrying data being transferred;
    a clock input for receiving synchronous clock signals;
    a delay circuit connected to said clock input for generating a delayed clock signal which is delayed from said synchronous clock signal a predetermined time period; and
    a pipeline connected to said data input for sampling the data on said data input in response to said delayed clock signal thereby stretching the sampling of incoming data;
    said delay circuit comprising:
        a read clock providing a read clock signal having a frequency delayed from said synchronous clock signal to time all possible arrivals of stretched, incoming data, and
        a local clock providing a local clock signal having a programmed frequency selected to define a local time domain;
    said pipeline comprising:
        a read latch clocked by said read clock signal for latching data bits from said data input, and
        a local latch clocked by said local clock signal for latching data bits from said read latch within said local time domain; and
        a selection device selecting the output of one of said read latch or said local latch.

2. The circuit according to claim 1 wherein said pipeline comprises an even cycle pipeline and an odd cycle pipeline, said even cycle pipeline sampling said data input in response to an even cycle of said delayed clock signal, and said odd cycle pipeline sampling said data input in response to an odd cycle of said delayed clock signal.

3. The circuit according to claim 2 further comprising a selection clock signal having an even cycle and odd cycle, and wherein said pipeline comprises a selection device for selecting one of said even cycle pipeline or said odd cycle pipeline whereby the output of said even cycle pipeline is selected during the even cycle of said selection clock signal, and the output of said odd cycle pipeline is selected during the odd cycle of said selection clock signal.

4. The circuit according to claim 1 wherein data received on said data input is a series of bits having bit times measured between successive ones of the bits in said series of bits; and
    said read clock is delayed to latch data in said read latch after one half of a bit time and said local clock is timed to latch data in said local latch starting with a selected cycle of said local clock, thereby providing for capturing data bits having a greater range of arrivals with respect to the time domain of said local clock to be selected by said selection device.

5. A method for reading data transfers that are sent with a source synchronous clock signal, said method comprising:

receiving at a data input, data signals carrying data being transferred;

receiving at a clock input, synchronous clock signals;

generating a delayed clock signal which is delayed from said synchronous clock signal a predetermined time period;

sampling in a pipeline, the data on said data input in response to said delayed clock signal thereby stretching the sampling of incoming data;

delaying a read clock having a frequency delayed from said synchronous clock signal to time all possible arrivals of stretched, incoming data;

clocking a read latch in said pipeline by said read clock, thereby capturing all possible arrivals of stretched, incoming data;

programming a local clock signal having a programmed frequency selected to define a local time domain;

clocking a local latch in said pipeline by said local clock signal, thereby capturing latched data of said read latch within said local time domain; and selecting the output of one of said read latch or said local latch.

6. The method according to claim 5 further comprising sampling with an even cycle pipeline, said data input in response to an even cycle of said delayed clock signal, and sampling with an odd cycle pipeline, said data input in response to an odd cycle of said delayed clock signal.

7. The method according to claim 6 further comprising selecting one of said even cycle pipeline or said odd cycle pipeline whereby the output of said even cycle pipeline is selected during the even cycle of a selection clock signal, and the output of said odd cycle pipeline is selected during the odd cycle of said selection clock signal.

8. The method according to claim 5 wherein data received on said data input is a series of bits having bit times measured between successive ones of the bits in said series of bit; and delaying said read clock to latch data in said read latch after one half of a bit time and timing said local clock to latch data in said local latch starting with a selected cycle of said local clock, thereby providing for capturing data bits having a greater range of arrivals with respect to the time domain of said local clock to be selected by said selection device.

* * * * *